(12) United States Patent
Chemali et al.

(10) Patent No.: US 11,171,498 B2
(45) Date of Patent: Nov. 9, 2021

(54) NEURAL-NETWORK STATE-OF-CHARGE ESTIMATION

(71) Applicant: The Trustees of Columbia University in the City of New York, New York, NY (US)

(72) Inventors: Ephram Chemali, Ontario (CA); Matthias Preindl, New York, NY (US)

(73) Assignees: The Trustees of Columbia University in the City of New York, New York, NY (US); McMaster University, Ontario (CA)

( * ) Notice: Subject to any disclaimer, the term of this patent is extended or adjusted under 35 U.S.C. 154(b) by 89 days.

(21) Appl. No.: 16/194,596

(22) Filed: Nov. 19, 2018

(65) Prior Publication Data

US 2019/0157891 A1     May 23, 2019

Related U.S. Application Data

(60) Provisional application No. 62/588,510, filed on Nov. 20, 2017.

(51) Int. Cl.
| | | |
|---|---|---|
| *H02J 7/00* | (2006.01) | |
| *G06N 3/04* | (2006.01) | |
| *G01R 31/382* | (2019.01) | |
| *H01M 10/42* | (2006.01) | |

(52) U.S. Cl.
CPC .......... *H02J 7/0047* (2013.01); *G01R 31/382* (2019.01); *G06N 3/04* (2013.01); *H02J 7/0048* (2020.01); *H02J 7/0091* (2013.01); *H01M 10/4257* (2013.01)

(58) Field of Classification Search
CPC ...... H02J 7/0047; H02J 7/0048; H02J 7/0091; G01R 31/382; G01R 31/392; G06N 3/04
USPC ........... 320/132, 133, 134, 152, 157; 702/63
See application file for complete search history.

(56) References Cited

U.S. PATENT DOCUMENTS

| | | | |
|---|---|---|---|
| 8,680,815 | B2 | 3/2014 | Wang et al. |
| 8,719,195 | B2 | 5/2014 | Frisch et al. |
| 2008/0234956 | A1 | 9/2008 | Mizuno et al. |
| 2009/0326841 | A1 | 12/2009 | Zhang et al. |
| 2010/0324848 | A1 | 12/2010 | Cho et al. |
| 2012/0271578 | A1 | 10/2012 | Nareid |

(Continued)

FOREIGN PATENT DOCUMENTS

| | | |
|---|---|---|
| CN | 104881001 A | 9/2015 |
| EP | 2762907 A1 | 8/2014 |
| WO | 2014/119123 A1 | 8/2014 |

OTHER PUBLICATIONS

S. Tong, "Battery state of charge estimation using a load-classifying neural network," Journal of Energy Storage, vol. 7, pp. 236-243, Aug. 2016.

(Continued)

*Primary Examiner* — Edward Tso
*Assistant Examiner* — Aaron Piggush
(74) *Attorney, Agent, or Firm* — Occhiuti & Rohlicek LLP

(57) ABSTRACT

An approach to control or monitoring of battery operation makes use of a recurrent neural network (RNN), which receives one or more battery attributes for a Lithium ion (Li-ion) battery, and determines, based on the received one or more battery attributes, a state-of-charge (SOC) estimate for the Li-ion battery.

16 Claims, 11 Drawing Sheets

(56) References Cited

U.S. PATENT DOCUMENTS

| | | | |
|---|---|---|---|
| 2013/0119921 A1* | 5/2013 | Choe | H01M 10/44 |
| | | | 320/106 |
| 2017/0023649 A1 | 1/2017 | You et al. | |
| 2018/0136285 A1* | 5/2018 | You | B60L 58/12 |
| 2020/0081070 A1* | 3/2020 | Chemali | G06N 3/08 |

OTHER PUBLICATIONS

X. Hu et al., "Condition Monitoring in Advanced Battery Management Systems: Moving Horizon Estimation Using a Reduced Electrochemical Model," in IEEE/ASME Transactions on Mechatronics, vol. 23, No. 1, pp. 167-178, Feb. 2018.

X. Hu et al., "Fuzzy Clustering Based Multi-model Support Vector Regression State of Charge Estimator for Lithium-ion Battery of Electric Vehicle," 2009 International Conference on Intelligent Human-Machine Systems and Cybernetics, pp. 392-396, 2009.

A. Krizhevsky et al., "ImageNet Classification with Deep Convolutional Neural Networks," Advances in Neural Information Processing Systems, pp. 1-9, 2012.

K. He et al., "Deep Residual Learning for Image Recognition," Arxiv.Org, pp. 171-180, 2015.

L. Deng, "Deep Learning: Methods and Applications," Foundations and Trends® in Signal Processing, vol. 7, No. 3-4, pp. 197-387, 2014.

D. Ciresan et al., "Multi-Column Deep Neural Network for Traffic Sign Classification," Neural Network, vol. 32, pp. 333-338, 2012.

J. Ma et al., "Deep Neural Nets as a Method for Quantitative Structure-Activity Relationships," Journal of Chemical Information and Modeling, vol. 55, No. 2, pp. 263-274, Jan. 2015.

D. Wang et al., "Deep Learning for Identifying Metastatic Breast Cancer," ArXiv Preprint, 1-6arXiv:1591239, 2016.

United States Environmental Protection Agency, Vehicle and Fuel Emissions Testing, https://www.epa.gov/vehicle-and-fuel-emissions/testing/dynamometer-driveschedules#vehicleDDS, (2017).

P. Kollmeyer, "Panasonic 18650PF Li-ion Battery Data," Mendeley Data, v1, (2018) https://doi.org/10.17632/wykht8y7tg.1.

A. Emadi, "Advanced Electric Drive Vehicles," New York: CRC Press, 2015.

X. Hu et al., "Advanced Machine Learning Approach for Lithium-Ion Battery State Estimation in Electric Vehicles," in IEEE Transactions on Transportation Electrification, vol. 2, No. 2, pp. 140-149, Jun. 2016.

D. Andre et al., "Comparative study of a structured neural network and an extended Kalman filter for state of health determination of lithium-ion batteries in hybrid electricvehicles," in Engineering Applications of Artificial Intelligence, vol. 26, No. 3, pp. 951-961, Mar. 2013.

H. Dong et al., "Lithium-ion battery state of health monitoring and remaining useful life prediction based on support vector regression-particle filter," Journal of Power Sources, vol. 271, pp. 114-123, Dec. 2014.

D. Liu et al., "Prognostics for state of health estimation of lithium-ion batteries based on combination Gaussian process functional regression," vol. 53, No. 6, pp. 832-839, Jun. 2013.

L. McCurlie et al., "Fast Model Predictive Control for Redistributive Lithium-Ion Battery Balancing," in IEEE Transactions on Industrial Electronics, vol. 64, No. 2, pp. 1350-1357, Feb. 2017.

C. Weng et al., "State-of-health monitoring of lithium-ion battery modules and packs via incremental capacity peak tracking," Applied Energy, vol. 180, pp. 360-368, Oct. 2016.

A. Ganguli et al., "Embedded fiber-optic sensing for accurate internal monitoring of cell state in advanced battery management systems part 2: Internal cell signals and utility for state estimation," Journal of Power Sources, vol. 341, pp. 474-482, Feb. 2017.

M. Dubarry et al., "State of health battery estimator enabling degradation diagnosis: Model and algorithm description," Journal of Power Sources, vol. 360, pp. 56-69, Aug. 2017.

"World Energy Outlook Special Report: Energy and Air Pollution," International Energy Agency, pp. 1-6, Jun. 2016.

E. Chemali et al., "Electrochemical and electrostatic energy storage and management systems for electric drive vehicles: State-of-the-art review and future trends," IEEE Journal of Emerging and Selected Topics in Power Electronics, vol. 4, No. 3, pp. 1117-1134, Sep. 2016.

P. Malysz et al., "State-of-charge and state-of-health estimation with state constraints and current sensor bias correction for electrified powertrain vehicle batteries," IET Electrical Systems in Transportation, vol. 6, No. 2, pp. 136-144, 2016.

W. Waag et al., "Critical review of the methods for monitoring of lithium-ion batteries in electric and hybrid vehicles," Journal of Power Sources, vol. 258, pp. 321-339, 2014.

R. Ahmed et al.,"Reduced-Order Electrochemical Model Parameters Identification and SOC Estimation for Healthy and Aged Li-Ion Batteries Part I: Parameterization Model Development for Healthy Batteries," in IEEE Journal of Emerging and Selected Topics in Power Electronics, vol. 2, No. 3, pp. 659-677, Sep. 2014.

R. Ahmed et al., "Reduced-Order Electrochemical Model Parameters Identification and State of Charge Estimation for Healthy and Aged Li-Ion Batteries—Part II: Aged Battery Model and State of Charge Estimation," in IEEE Journal of Emerging and Selected Topics in Power Electronics, vol. 2, No. 3, pp. 678-690, Sep. 2014.

M.A. Roscher et al., "Dynamic electric behavior and open-circuit-voltage modeling of LiFePO4-based lithium ion secondary batteries," Journal of Power Sources, vol. 196, pp. 331-336, 2011.

J. Li et al., "A comparative study of state of charge estimation algorithms for LiFePO4 batteries used in electric vehicles," Journal of Power Sources, vol. 230, pp. 244-250, 2013.

L. Liu et al., "Integrated System Identification and State-of-Charge Estimation of Battery Systems," in IEEE Transactions on Energy Conversion, vol. 28, No. 1, pp. 12-23, Mar. 2013.

M. Gholizadeh et al., "Estimation of state of charge, unknown nonlinearities, and state of health of a lithium-ion battery based on a comprehensive unobservable model," IEEE Transactions on Industrial Electronics, vol. 61, No. 3, pp. 1335-1344, Mar. 2014.

X. Chen et al., "A novel approach for state of charge estimation based on adaptive switching gain sliding mode observer in electric vehicles," Journal of Power Sources, vol. 246, pp. 667-678, 2014.

C. Hu et al., "A multiscale framework with extended kalman filter for lithium-ion battery {SOC} and capacity estimation," Applied Energy, vol. 92, pp. 694-704, 2012.

F. Sun et al., "Adaptive unscented Kalman filtering for state of charge estimation of a lithium-ion battery for electric vehicles," Energy, vol. 36, No. 5, pp. 3531-3540, May 2011.

T. Hansen et al., "Support vector based battery state of charge estimator," Journal of Power Sources, vol. 141, No. 2, pp. 351-358, 2005.

J.A. Anton et al., "Battery state-of-charge estimator using the SVM technique," Applied Mathematical Modelling, vol. 37, No. 9, pp. 6244-6253, May 2013.

J.A. Anton et al., "Support Vector Machines Used to Estimate the Battery State of Charge," IEEE Transactions on Power Electronics, vol. 28, No. 12, pp. 5919-5926, Dec. 2013.

Y. Lee et al., "Soft Computing for Battery State-of-Charge (BSOC) Estimation in Battery String Systems," in IEEE Transactions on Industrial Electronics, vol. 55, No. 1, pp. 229-239, Jan. 2008.

W. Chang, Estimation of the state of charge for a LFP battery using a hybrid method that combines a RBF neural network, an OLS algorithm and AGA,: International Journal of Electrical Power & Energy Systems, vol. 53, pp. 603-611, Dec. 2013.

M. Charkhgard et al., "State-of-Charge Estimation for Lithium-Ion Batteries Using Neural Networks and EKF," in IEEE Transactions on Industrial Electronics, vol. 57, No. 12, pp. 4178-4187, Dec. 2010.

J. Du et al., "State of charge estimation for Li-ion battery based on model from extreme learning machine," Control Engineering Practice, vol. 26, pp. 11-19, May 2014.

J. Meng et al., "Lithium Polymer Battery State-of-Charge Estimation Based on Adaptive Unscented Kalman Filter and Support Vector Machine," in IEEE Transactions on Power Electronics, vol. 31, No. 3, pp. 2226-2238, Mar. 2016.

(56) References Cited

OTHER PUBLICATIONS

Z. Deng et al., "Online available capacity prediction and state of charge estimation based on advanced data-driven algorithms for lithium iron phosphate battery," Energy, vol. 112, pp. 469-480, Oct. 2016.
Y. LeCun et al., "Deep learning," Nature, vol. 521, No. 7553, pp. 436-444, May 2015.
I. Sutskever, "Training Recurrent Neural Networks," Ph.D. dissertation, University of Toronto, 2013.
S. Hochreiter et al., "Long short-term memory," Neural Computation, vol. 9, No. 8, pp. 1735-1780, 1997.
G. Hinton et al., "Deep Neural Networks for Acoustic Modeling in Speech Recognition: The Shared Views of Four Research Groups," in IEEE Signal Processing Magazine, vol. 29, No. 6, pp. 82-97, Nov. 2012.
G.E. Dahl et al., Context-Dependent Pre-Trained Deep Neural Networks for Large-Vocabulary Speech Recognition, IEEE Transactions on Audio, Speech, and Language Processing, vol. 20, No. 1, pp. 30-42, Jan. 2012.
A. Graves et al., "Speech Recognition with Deep Recurrent Neural Networks," 2013 IEEE International Conference on Acoustics, Speech and Signal Processing (ICASSP), No. 3, pp. 6645-6649, 2013.
D. Amodei et al., "Deep Speech 2: End-to-End Speech Recognition in English and Mandarin," ArXiv e-prints, Dec. 2015.
R. Pascanu et al., "On the difficulty of training recurrent neural networks." 30th International Conference on Machine Learning (ICML), vol. 28, pp. 1310-1318, 2013.
S. Hochreiter, "The vanishing gradient problem during learning recurrent neural nets and problem solutions," International Journal of Uncertainty, Fuzziness and Knowledge-Based Systems, vol. 6, No. 2, pp. 107-116, Apr. 1998.
M. Abadi et al., "TensorFlow: Large-Scale Machine Learning on Heterogeneous Systems," pp. 1-19, Nov. 2015.
W. Zaremba et al., "Recurrent neural network regularization," arXiv preprint arXiv:1409.2329, Feb. 2015.
D. Kingma et al., "Adam: A method for stochastic optimization," CoRR, vol. abs/1412.6980, 2014.
Panasonic, "Panasonic NCR18650PF Lithium-Ion Battery Datasheet (Jun. 2016)," 2016.
Panasonic, "Introduction of NCR18650PF, Panasonic," 2013.
P. Kollmeyer, "Development and Implementation of a Battery-Electric Light-Duty Class 2a Truck including Hybrid Energy Storage," Ph.D. dissertation, The University of Wisconsin—Madison, 2015.
P. Kollmeyer et al., "Design of an electric powertrain for a Ford F150 crew cab truck utilizing a lithium battery pack and an interior PM synchronous machine drive," 2012 IEEE Transportation Electrification Conference and Expo (ITEC), pp. 1-8, 2012.
X. Hu et al., "Technological Developments in Batteries: A Survey of Principal Roles, Types, and Management Needs," in IEEE Power and Energy Magazine, vol. 15, No. 5, pp. 20-31, Sep.-Oct. 2017.
Z. Li et al., "On state-of-charge determination for lithium-ion batteries," Journal of Power Sources, vol. 348, pp. 281-301, Apr. 2017.
S. Sepasi et al., "Improved extended Kalman filter for state of charge estimation of battery pack," Journal of Power Sources, vol. 255, pp. 368-376, Jun. 2014.
W. Wang et al., "Comparison of Kalman Filter-based state of charge estimation strategies for Li-Ion batteries," 2016 IEEE Transportation Electrification Conference and Expo (ITEC), pp. 1-6, 2016.

\* cited by examiner

NEURAL-NETWORK STATE-OF-CHARGE ESTIMATION

CROSS-REFERENCE TO RELATED APPLICATIONS

This application claims the benefit of U.S. Provisional Application No. 62/588,510, filed Nov. 20, 2017, which is incorporated by reference.

PRIOR DISCLOSURES BY INVENTOR

Ephrem Chemali, Phillip J. Kollmeyer, Matthias Preindl, Ryan Ahmed, and Ali Emadi. "Long short-term memory networks for accurate state-of-charge estimation of Li-ion batteries." *IEEE Transactions on Industrial Electronics* 65, no. 8 (August 2018): 6730-6739. This publication is incorporated herein by reference.

BACKGROUND

This application relates to state-of-charge estimation for batteries using artificial neural networks, and in particular relates to use of Long Short-Term Memory (LSTM) neural networks.

State-of-Charge (SOC) is maybe defined as the remaining charge within the battery pack and is given by the residual capacity of the battery divided by its nominal capacity. There exists no direct way to measure SOC, therefore estimation approaches are used. SOC estimation is important for reliable operation of the electric powered vehicles because this quantity directly gauges a vehicle?s remaining driving range and is used for the battery balancing system. SOC estimation can be a cumbersome task since the battery undergoes erratic dynamics during repeated acceleration and deceleration of electrified vehicles.

In general, the SOC can be considered to be a nonlinear function of variables including temperature and past discharge/charge current. Traditionally, two SOC estimation techniques have been used; open circuit voltage based techniques and coulomb counting. These are commonly known to have their limitations and have been generally displaced by more sophisticated methods. Typically, these methods use an (adaptive) cell model, voltage, and current measurements to issue an estimate, e.g. Luenberger observer, adaptive observer, sliding mode observer, and Kalman Filters. These strategies tend to be computationally intensive and typically require additional parameters or different models to perform SOC estimation at varying ambient conditions.

Strategies involving data analytics have also been used in the past; these have relied on conventional machine learning techniques such as Support Vector Machines (SVM) and Neural Networks.

SUMMARY

In one aspect, in general, an approach to control or monitoring of battery operation makes use of a recurrent neural network (RNN), which receives one or more battery attributes for a Lithium ion (Li-ion) battery, and determines, based on the received one or more battery attributes, a state-of-charge (SOC) estimate for the Li-ion battery.

In another aspect, in general, a method for monitoring battery operation includes receiving by a recurrent neural network (RNN) a time series of values one or more battery attributes for a battery. Based on the received time series, the RNN determines a state estimate for the battery.

Aspects can include one or more of the following.

The battery comprises a rechargable battery

Receiving the time series of values of the attributes includes receiving a time series spanning multiple charging and discharging cycles.

Receiving time time series of the values the one or more battery attributes comprises receiving values of one or more of a battery voltage, a battery current, and a battery temperature.

The battery comprises a Lithium-ion (Li-ion) battery.

The state estimate for the battery comprises a time series of values of state estimates corresponding to the time series of the values of the one or more battery attributes.

The state estimate comprises a state-of-charge (SOC) estimate.

The state estimate for the battery comprises data representative of one or more of battery capacity, and battery resistance.

Operation of at least one of the battery or a system powered by the battery is controlled based on the determined state estimate for the battery.

The RNN is periodically configured according to one or more of age of the battery, and a long-term condition of the battery.

The recurrent neural network includes a memory cell configured to be selectively updated according to inputs to the recurrent neural network.

The recurrent neural network comprises a Long Short-Term Memory cell.

In another aspect, in general, a system for monitoring battery operation includes at least one sensor for measuring one or more battery attributes of at least one battery. A recurrent neural network (RNN) system is configured according to stored numerical parameters to receive a time series of values one or more battery attributes for a battery from the at least one sensor, and determining, based on the received time series, a state estimate for the battery. The RNN comprises a memory cell configured to be selectively updated according to inputs to the recurrent neural network. The one or more battery attributes may include a battery voltage, a battery current, and a battery temperature.

Advantages of one or more embodiments may include the the following.

The training algorithm for the RNN can self-learn all the network parameters thereby freeing researchers from hand-engineering and parameterizing the models themselves. In contrast, other in at least some traditional methods, only after the parameters are fitted to a battery model, and after the time-consuming covariance matrix in a Kalman filter is determined, for example, can the algorithm operate in the field.

The machine learning technique allows encoding of the characteristic behavior at different ambient temperatures within the network while maintaining great estimation accuracy at these different ambient temperatures.

State of Charge (SOC) estimation is critical to ensure reliable operation of the electric drive since this quantity directly gauges a vehicle's remaining driving range and is necessary for the battery balancing system. However, SOC estimation is a cumbersome task since the battery undergoes erratic dynamics during repeated acceleration and deceleration of electrified vehicles. Because there exists no direct way to measure SOC, the solution to technical problem of SOC estimation is critical to operation of the vehicle.

DETAILED DESCRIPTION

System Overview

Figure 1:
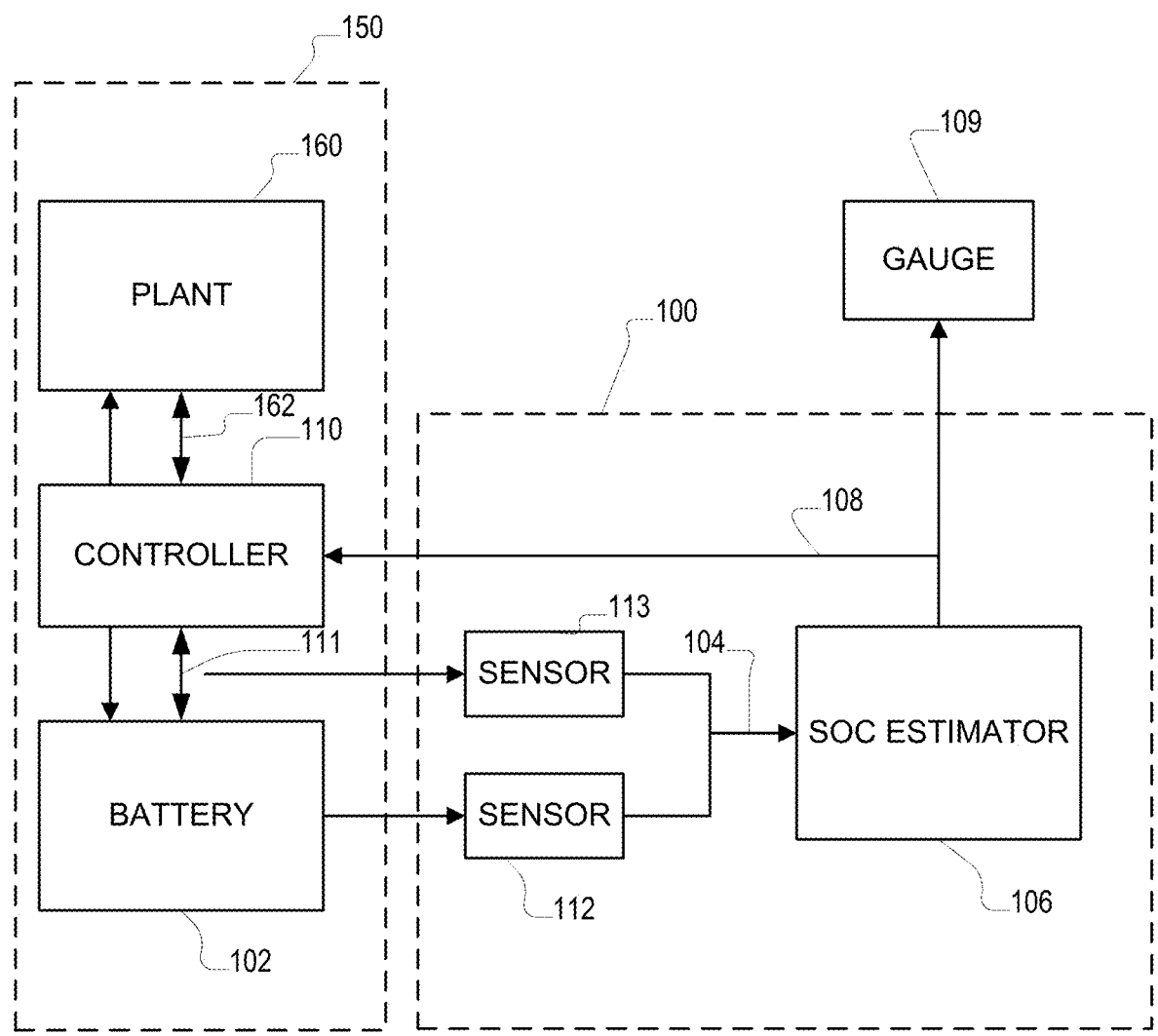
FIG. 1 is a system including a State-of-Charge (SOC) estimation system.

Embodiments of the approach described below are used to process a time series of measurable characteristics of a battery system and output an estimate of a state of a battery system. The battery system may be referred to below as a "battery" understanding that the term may include other elements, including electronics and physical systems of the battery system. In particular, embodiments of the approach are directed to output of an estimate of a state of charge (SOC) of the battery system. In general, the SOC represents the remaining electrical charge in the battery system, for example, as measure in units of electrical charge (e.g., Coulombs) or as corresponding quantity (e.g., a normalized number between 0% and 100% representing a fractional charge state of the battery system).

The measurable characteristics may be represented as a vector of real quantities $x_k$ for the $k^{th}$ sample in the series. (In some description below, the variable $\Psi_k$ is used synonymously to represent such a vector of quantities.) For example, the characteristics are measured at a rate of one vector measurement per second. For example, each vector may include the terminal current, the terminal voltage, and a battery temperature at the measurement time. The measurement does not necessarily include all three of these quantities, and may include other quantities, such as an age of battery system. Furthermore, related quantities, such as normalized current and voltage (e.g., normalized by nominal or maximum values for the battery system) and time averaged or filtered versions of such signals may be used may be used in addition or as alternatives.

The estimates of the battery state are represented as a real scalar or vector quantity $y_k$ for each time sample. For example, as introduced above, for each time sample, the output $y_k$ may be a number between 0.0 and 1.0. (In some description below, the variable $SOC_k$ is used to represent such a state of charge.)

In general, the approach implements a non-linear function $y_k = N(x_1, x_2, \ldots, x_k)$, which accumulates the information in the history of measurements from the time the battery system was known to be in a fully charged state (e.g., at time index 1). A recurrent structure may be used in which a hidden estimation state $s_k$ is maintained such that the output $y_k$ is a (generally non-linear) function of $s_k$, and $s_k$ is a (generally non-linear) function of $x_k$ and $s_{k-1}$.

Various structures of the function N may be used, and in general, the function is parameterized by a set of parameters that are estimated ("trained") in a manner described more fully below. One particular structure that may be used is a Recurrent Neural Network (RNN) with one hidden layer. In such an example, the function N is parametrized by numerical matrices U, V, and W, that define the function according to the following computations:

$$u_k = W^T s_{k-1} + U^T x_k$$

$$s_k = \eta_s(u_k)$$

$$o_k = V^T s_k$$

$$y_k = \eta_o(o_k)$$

where $\eta_s$ and $\eta_o$ are non-linear scalar functions that are applied element-wise to their arguments. For example, these may be selected from a sigmoid function, a hyperbolic tangent, and a rectifier (i.e., maximum of zero and the argument). More than one layer may be optionally used.

In order to determine the parameters of the function N, which may also be referred to as "weights," a training data set is used. For example, an accurate battery system state $y_k^*$ is monitored, for example, using an accurate "Coulomb counting" apparatus, as well as the corresponding measurable quantities $x_k$. One or more sequence $(x_k, y_k^*)$, $k = 1, \ldots, T$ are collected, and are collectively referred to as the "training data" for the parameter estimation. For example, each sequence corresponds to repeated charge-discharge cycles of one battery system.

Various approaches to parameter estimation may be used to match the training data according to a specified quantified objective $L(y_k, y_k^*)$. For example, the objective may be $$\sum_k L(y_k, y_k^*) = \frac{1}{2} \sum_k (y_k - y_k^*)^2$$

or $$\sum_k L(y_k, y_k^*) = \sum_k |y_k - y_k^*|^2$$

Referring to FIG. 1, an exemplary state of charge (SOC) estimation system 100 is configured to make a determination of a state of charge (SOC) of a battery 102. In this example, the battery 102 is a Lithium ion (Li-ion) battery, but other battery technologies may be addressed with the same approach. The battery may be part of a battery powered system 150, which includes the battery 102, a controller 110 coupled to the battery, and a plant 160, which may be a source and/or sink of power. Very generally, the controller 110 in this example is coupled to the battery over a power connection 111 (e.g., two electrical conductors), and optionally is coupled over a control path over which environmental control may be exerted on the battery (e.g., temperature, pressure, etc.). The controller mediates power transfer between the battery 102 and the plant 162, which is coupled to the controller over a power connection 162. In some examples, the SOC estimation system 100 may be configured to provide an estimate of the SOC of the battery 102 to the controller 110; in other examples, the SOC estimation system 100 operates without communication with the controller 110, for example, providing the estimate of the SOC via a gauge 109 to a user.

The SOC estimation system 100 includes sensors 112, 113 that are used to monitor the battery 102 and provide quantitative attributes associated with the battery over time, for example, as a time-sampled digitized signal. A first sensor 112 monitors environmental or other physical conditions of the battery, for instance temperature, pressure, or age while a second sensor 113 monitors the power connection 112 over which power flows into and out of the battery, and provides attributes including voltage (e.g., voltage across the two conductors, or across two terminals of the battery to which such conductors are connected) and current passing over the conductors of the power connection and/or an accumulation or other averaging or filtering of current over time). Together, all the attributes monitored by the sensors 112, 113 form a vector time signal 104, with the $k^{th}$ sample denoted $x_k$ or $\Psi_k$.

The SOC estimation system 100 includes a SOC estimator 106, which receives the attributes 104 from the sensors 112, 113, and outputs a SOC estimate 108. As introduced above, the SOC estimate may optionally be provided back to the controller 110 for the battery, to a gauge 109, or for other purposes (e.g., logging, long-term battery health assessment, etc.). The SOC estimator 106 is parameterized estimator and configured with values of a set of configuration parameters. In this example, the SOC estimator makes use of a particular structure of a recurrent neural network (RNN), which is described in more detail below. As discussed above, the output of the SOC estimator 106 generally includes the state of charge (e.g., a number between 0% and 100% reprenting the percentage of full capacity remaining in the charge of the battery), but may additionally or alternatively include other quantities characterizing the state of the battery, for instance, an estimate of the internal resistance of the battery, the remaining lifetime of the battery, and so forth.

Classical RNNs generally provide the output of the neural network at time k−1 as an further input at time k augmenting the input provided to the neural network. Such classical RNNs known have certain difficulties capturing long-range dependencies, at least in part resulting from training procedures in which gradients of the weights either explode or vanish during training. The neural network structure used in this exemplary embodiment include RNNs with Long Short-Term Memory (LSTM) cells to better capture long-term dependencies within a sequence of battery attributes.

Neural Network

Figure 2:
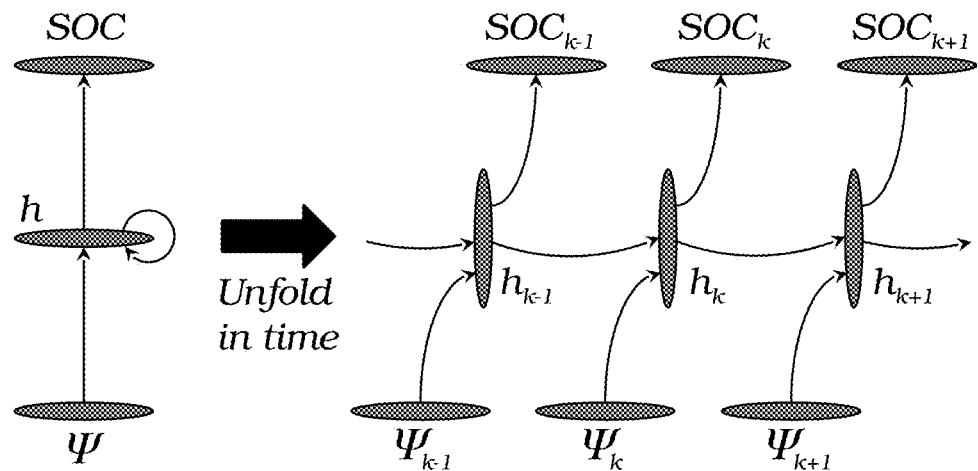
FIG. 2 is an architecture of a recurrent neural network.

A LSTM-RNN, whose architecture is shown in FIG. 2, can represent nonlinear dynamic systems by mapping input sequences to output sequences [Hochreiter and Schmidhuber, 1997]. The input data is given by $\Psi_k=[V(k), I(k), T(k)]$ where V(k), I(k) and T(k) represent the voltage, current and temperature of the battery at time step k. $h_{k-1}$ denotes the hidden layer of the LSTM-RNN at time step k−1. The output of the LSTM-RNN is the estimated SOC at every time step.

Figure 3:
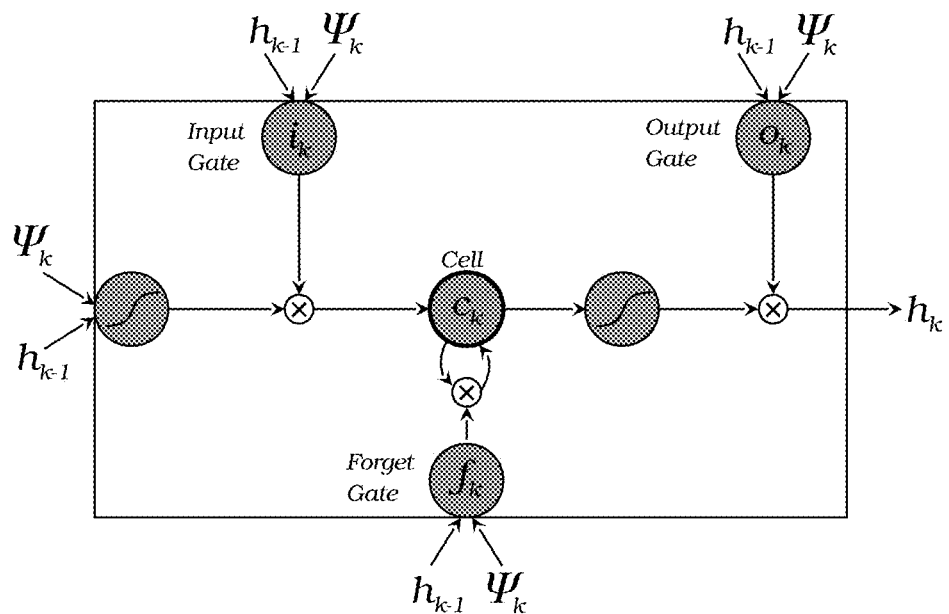
FIG. 3 is a Long Short-Term Memory cell.

When LSTM-RNNs are applied towards SOC estimation, a typical dataset used to train the networks is given by $D=\{(\Psi_1, SOC_1^*), (\Psi_2, SOC_2^*), \ldots, (\Psi_N, SOC_N^*)\}$, where $SOC_k^*$ is the ground-truth value or the observable state-of-charge value at time step k and $\Psi_k$ is the vector of inputs also at time step k. The vector of inputs is defined as $\Psi_k=[V(k), I(k), T(k)]$, where V(k), I(k), T(k) are the voltage, current and temperature of the battery measured at time step k, respectively. The Long Short-Term Memory cell whose schematic representation is shown in FIG. 3, is equipped with a memory cell, $c_k$, which stores the long-term dependencies. $\Psi_k$ and $h_{k-1}$ are the input data layer at current time step, k, and hidden layer at previous time step, k−1, respectively. $i_k$, $o_k$, $f_k$ and $c_k$ are the input, output and forget gates as well as the memory cell, respectively. Cells with sigmoidal notations represent nonlinearities outlined in equation 1.

During training, the input, output and forget gates allow the LSTM to forget or write new information to the memory cell. The overall LSTM-RNN cell is therefore automatically configured such that the memory cell maintains a most useful summary of past operation of the battery to be used in making estimates of the battery state in the future.

The LSTM unit can be represented by the following composite function, $$i_k = \eta(W_{\Psi i}\Psi_k + W_{hi}h_{k-1} + b_i)$$

$$f_k = \eta(W_{\Psi f}\Psi_k + W_{hf}h_{k-1} + b_f)$$

$$c_k = f_k c_{k-1} + i_k \tan h(W_{\Psi c}\Psi_k + W_{hc}h_{k-1} + b_c)$$

$$o_k = \eta(W_{\Psi o}\Psi_k + W_{ho}h_{k-1} + b_o)$$

$$h_k = o_k \tan h(c_k), \qquad (1)$$

where the initial hidden state, $h_0$, is set to a zero matrix, $\eta$ is the sigmoid function and i, f, o and c are the input, forget, output gates and memory cell, respectively. They are called gates since they are a sigmoid function which can be zero valued thus possessing the ability to inhibit the flow of information to the next computational node. Each gate possesses its set of network weights which are denoted by W. The subscripts of W describe the transformation occurring between the two respective components, e.g. the input-output gate matrix is denoted by $W_{\Psi o}$, the hidden-input gate matrix is denoted by $W_{hi}$, etc. A bias, b, is added to the matrix multiplication at each gate to increase the networks flexibility to fit the data. A final fully-connected layer performs a linear transformation on the hidden state tensor $h_k$ to obtain a single estimated SOC value at time step k. This is done as follows:

$$SOC_k = V_{out} h_k + b_y, \qquad (2)$$

where $V_{out}$ and $b_y$ are the fully-connected layer's weight matrix and biases, respectively. The disparity between the LSTM-RNN's estimated SOC and the measured one is best represented by the following loss function computed at the end of each forward pass;

$$L = \sum_{k=0}^{N} \frac{1}{2}(SOC_k - SOC_k^*)^2, \qquad (3)$$

where N is the length of the sequence and $SOC_k$ as well as $SOC_k^*$ are the estimated and ground truth values of SOC at time step k, respectively. A forward pass starts when the training data is fed into the network and ends when the SOC estimates are generated at each time step as well as when the errors and the overall loss are calculated. However, a training epoch, $\epsilon$, includes one forward pass and one backward pass which is when the network weights, W, and biases, b, are updated. To do this, an optimization method called Adam is used [Kingma and Ba, 2014] to update the network weights and biases based on the gradient of the loss function. This is given by:

$$m_\epsilon = \beta_1 m_{\epsilon-1} \nabla L(W_{\epsilon-1}) \quad (4)$$
$$r_\epsilon = \beta_2 r_{\epsilon-1} \nabla L(W_{\epsilon-1})^2$$
$$\tilde{m}_\epsilon = m_\epsilon/(1-\beta_1^\epsilon)$$
$$\tilde{r}_\epsilon = r_\epsilon/(1-\beta_2^\epsilon)$$
$$W_\epsilon = W_{\epsilon-1} - \alpha \frac{\tilde{m}_\epsilon}{\tilde{r}_\epsilon - \kappa},$$

where, L is the loss function, $\beta_1$ and $\beta_2$ are decay rates in some examples set to 0.9 and 0.999, respectively, $\alpha=10^{-4}$ is the training step size and K is a constant term set in some examples to $10^{-8}$. $W_\epsilon$ denotes the matrix of neural network parameters ("weights") at the current training epoch and can be a placeholder for $W_{\psi i}$, $W_{hi}$, $W_{\psi f}$ etc. These gate matrices, the output weight matrix, $V_{out}$, as well as the biases are initialized with a normally distributed random number generator having mean 0 and standard deviation of 0.05. It is only during training that a forward and backward pass are performed to continuously update the network weights until a convergence criteria is met. With the backward pass, the network self-learns its weights, offering significant improvements over traditional SOC estimation strategies which require the time-consuming construction and parameterization of hand-engineered battery models.

During validation, a forward pass is solely required to generate the estimated SOC values at each time step and no backward pass is needed since the network parameters have already been learned during training. The LSTM-RNN offers an advantage of lower computational overhead, once trained, since a forward pass is comprised of a series of matrix multiplications. This, in general, is less computationally intensive than other algorithms, which might contain differential equations, for example. In addition, the LSTM-RNN, as will be shown in the results section below, has the ability to encode the characteristic behavior of a battery at numerous ambient temperatures thus reducing the memory required to store different parameters for different ambient temperatures as is typically done for traditional battery models. Therefore, these latter advantages make LSTM-RNN a great candidate to perform estimation separately on many cells in a battery pack.

Many unique drive cycles are concatenated to form the training dataset and when compiled, this typically has a length of over 100,000 time steps. It may not be possible to enter a sequence as long as this into the training system (e.g. constrained by GPU memory), therefore, the LSTM-RNN models may be trained by feeding one batch of the sequence at a time which is commonly performed while training LSTM-RNNs. This is referred to as unrolling the LSTM cell in time for $\tilde{N}$ steps where $\tilde{N}$ is the batch length holding a smaller value than the total training sequence length, N, such that $\tilde{N}<N$. Usually, if the time constant of the inherent dynamics within the sequence is shorter than $\tilde{N}$, then the LSTM-RNN can still capture the time dependencies.

To evaluate the estimation performance of our networks, a few different error functions may be used. These include the Mean Absolute Error (MAE), the RMS error, the standard deviation of the errors (STDDEV) and the maximum error (MAX).

Experiments and Results

A Panasonic 18650 battery cell with a lithium nickel cobalt aluminum oxide ($LiNiCoAlO_2$ or NCA) chemistry, similar to the cell used in some Tesla vehicles, was tested [Panasonic, 2016]. The battery, which is rated to have 43 mΩ dc resistance has the following characteristics:

Nominal Open Circuit Voltage: 3.6V
Capacity: Min. 2.75 Ah/Typ. 2.9 Ah
Min/Max Voltage: 2.5V/4.2V
Mass/Energy Storage: 48 g/9.9 Wh
Minimum Charging Temperature: 10° C.
Cycles to 80% Capacity: 500 (100% DOD, 25° C.)

Figure 4:
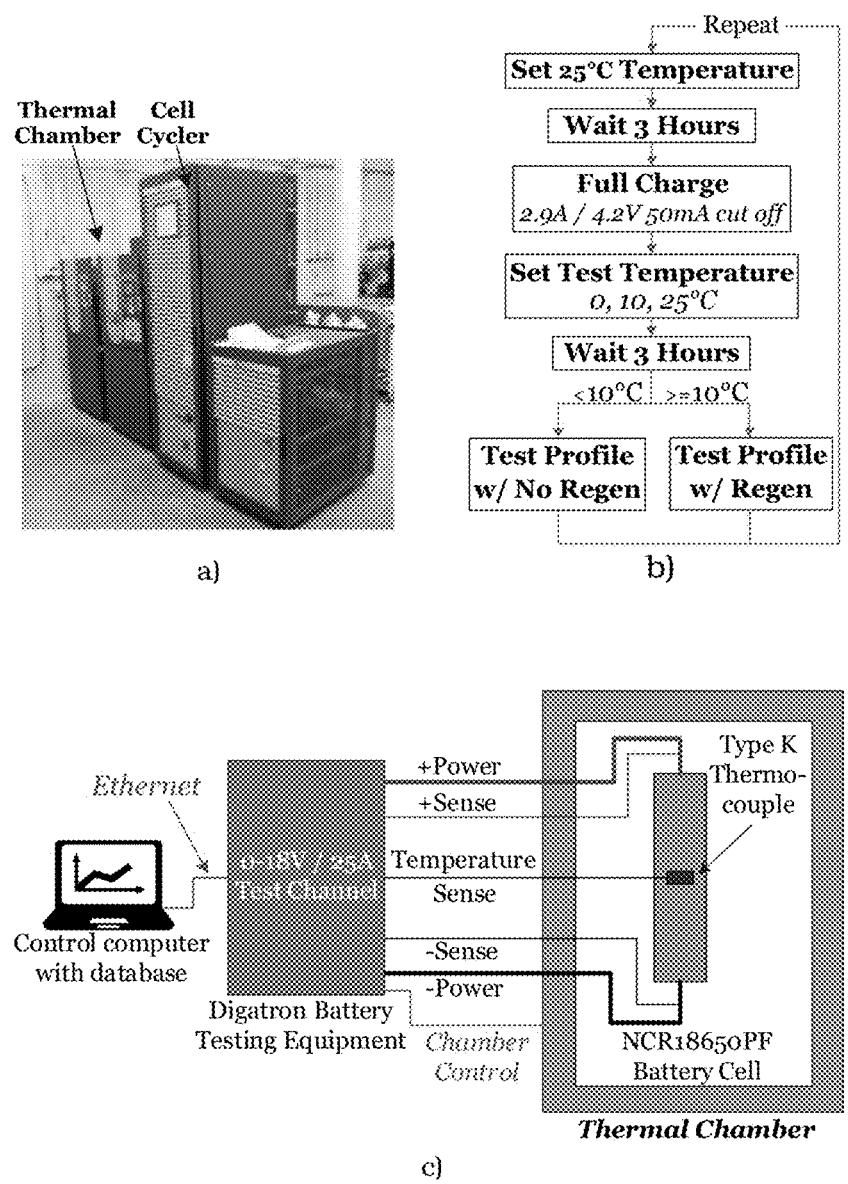
FIG. 4 is is an experimental setup including a) a photograph of equipment used for battery testing, b) a flowchart of the battery test procedure and c) a schematic of the test bench and data logging system.

All the testing was performed in a thermal chamber with cell testing equipment manufactured by Digatron Firing Circuits, as described below and shown in FIG. 4a).

Cycler Manufacturer: Digatron Firing Circuits
Test Channel Used: 25 A, 0-18V channel
Voltage/Current Accuracy: +/−0.1% Full Scale
Data Acquisition Rate Used: 10 Hz
Thermal Chamber: Cincinnati Sub Zero ZP-8
Size: 8 cu. Ft.
Accuracy: +/−0.5° C.

To generate training and validation data for the recurrent neural network, the battery was exposed to a selection of drive cycles at ambient temperatures ranging from 0 to 25° C. A set experimental procedure was used, as described in FIG. 4b). A schematic of the experimental apparatus is shown in FIG. 4c). The thermal chamber was first set to 25° C. followed by a 3 hour pause to allow the battery's internal temperature to reach 25° C. The battery was then fully charged with a constant current charge rate of 2.9 A (1 C) followed by a constant voltage charge at 4.2 V which was terminated when current fell below 50 mA. The thermal chamber temperature was then set to the desired ambient temperature to record the subsequent drive cycle, and, in turn, this was paused for three hours again to allow the battery's internal temperature to reach steady state. The battery is then discharged using a drive cycle power profile which includes regenerative braking (i.e. charging) power if the ambient temperature is greater than or equal to 10° C., the minimum temperature for which the battery is rated to charge. The current sensor that is used to measure current and to calculate capacity has an error of less than 25 mA. For the typical dataset, this sums to a cumulative error of under 40 mAh which is small compared to the 2900 mAh of battery capacity.

Figure 5:
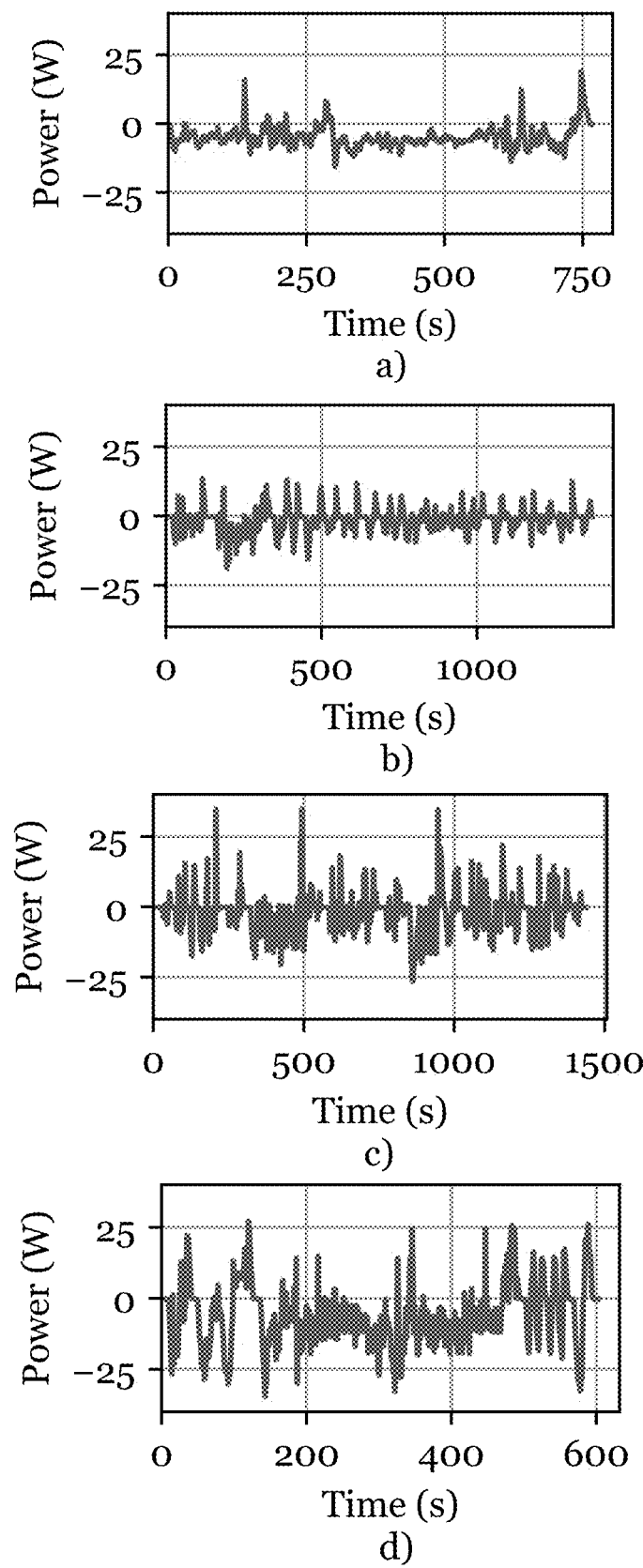
FIG. 5 is a set of graphs of drive cycle power profiles, scaled for a single cell of 35 kWh pack for a Ford F150 electric truck: a) HWFET, b) UDDS, c) LA92, d) US06.

During experimentation, the battery was exposed to 10 drive cycles. Each dataset consisted of a random combination of different drive cycles which included HWFET, UDDS, LA92 and US06. Constructing these unique datasets which were composed of various drive cycles, having a spectrum of different dynamics, provided the LSTM-RNN with a broad range of realistic driving conditions. These 10 cycles were applied on the battery at three different ambient temperatures (0, 10, or 25° C.). Training of the LSTM-RNN is performed on a subset of these 10 cycles (typically 8 to 9 cycles) and will henceforth be referred to as the training data while validation is performed on a completely different subset of cycles (usually 1 or 2) which are henceforth referred to as test cases. An additional test case, called the Charging Test Case, is recorded at 25° C. to examine the network's performance over a charging profile. Furthermore, a second additional test case is recorded during experimentation which exposes the battery cell to an ambient temperature increasing from 10 to 25° C. and is used to validate the LSTM-RNN's ability to adapt to a varying temperature. The drive cycle power profiles used are for an electric Ford F150 truck [Kollmeyer, 2015, Kollmeyer et al., 2012], with the power profile scaled for a single cell of a 35 kWh pack consisting of 3,680 of the Panasonic NCR18650PF cells. The power profile for the drive cycles has discharge power (negative power) as great as 40 W per cell and charge power (positive power) as great as 35 W per cell, as is shown in FIG. 5. This translates to peak current of around 18 A, or 6 C, which is a fairly typical peak C-rate for an electric vehicle application. The power profile is repeated until the battery's usable capacity is depleted. This is defined as 2.61 Ah when discharged at an ambient temperature of 25° C., 2.5 Ah at 10° C. and 2.32 Ah at 0° C.

Figure 6:
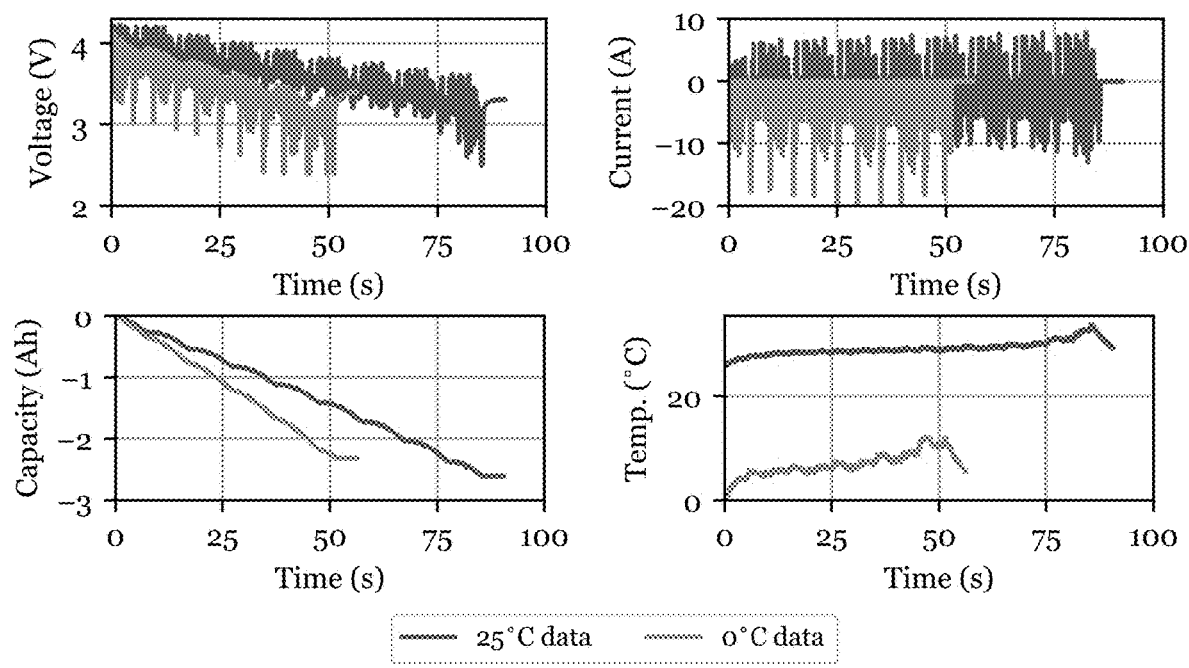
FIG. 6 is a set of graphs for a US06 drive cycle recorded at an ambient temperature of 25° C. and 0° C.

The measured voltage, current, amp-hours, and battery surface temperature are shown in FIG. 6 for the US06 drive cycle at an ambient temperature of 25° C. and 0° C. At 25° C. the current is relatively low, ≤3 C, and the battery voltage drop is not too significant. The temperature, measured at the surface of the cylindrical cell with a thermocouple, increases by a few degrees over the first 70 minutes of the drive, and then spikes to 34° C. as the terminal voltage falls, resistance increases, and the loss therefore increases. At 0° C., the battery resistance is much higher, resulting in significant voltage drop as is shown in FIG. 6. The higher resistance coupled with no regenerative braking energy due to the low temperature state, results in the drive cycle being repeated for 50 minutes at 0° C., while this was repeated for 85 minutes at 25° C. The battery also heats significantly, up to 13° C., due to the higher loss at low temperature.

Although the example LSTM-RNN tested is trained on data obtained from a Panasonic 18650PF cell, the same LSTM-RNN can be trained on any other type of battery cell. The network architecture does not need to change from one battery cell to another. The network might need to be retrained for a completely different battery, but it's architecture and the values of the network hyperparameters, like the learning rate, can remain the same.

As mentioned above, the vector of inputs fed into the LSTM-RNN is defined as $\Psi_k=[V(k), I(k), T(k)]$, where $V(k)$, $I(k)$, $T(k)$ are the voltage, current and temperature measurements of the battery at time step k, respectively. The mixed drive cycles were logged at a sampling frequency of 1 Hz and they ranged roughly between 4000 and 10000 seconds long. The following two subsections investigate the LSTM-RNN's SOC estimation accuracy when trained on a dataset recorded at a constant ambient temperature and at variable ambient temperatures, respectively.

SOC Estimation at Fixed Ambient Temperature

In this section, the network is trained on up to 8 mixed drive cycles while validation is performed on 2 discharge test cases. In addition, a third test case, called the Charging Test Case, which includes a charging profile is used to validate the networks performance during charging scenarios. In addition, the regenerative braking which results in charging currents of over 8 A, as can be seen from FIG. 6, allows us to test the network's performance at higher momentary charge rates. Regenerative braking charging current is not included for validation test cases recorded at the lower temperatures since the battery is not rated to charge at temperatures below 10° C. Celsius. In the Charging Test Case, charging is performed at 1 C (2.9 A). There was interest in examining an even faster charge rate, but the 1 C rate is already twice the datasheet's recommended charge rate so rates that are any higher than this are considered excessive and potentially dangerous. The LSTM-RNN's hidden layer has 500 computational nodes. A smaller number of computational nodes are possible, however the network can converge to a solution much quicker with a larger number of nodes while using a GPU. The computational time needed to train this network is about 4 hours.

The MAE achieved on each of the first two test cases is 0.807% and 1.252%, respectively. The MAE, RMS, STD-DEV and MAX performance metrics for these three test cases are outlined in the table below.

| Test Case | MAE(%) | RMS(%) | STDDEV(%) | MAX(%) |
|---|---|---|---|---|
| Test Case 1 at 10° C.* | 0.807 | 1.075 | 0.710 | 2.819 |
| Test Case 2 at 10° C.* | 1.252 | 1.541 | 0.898 | 4.312 |
| Charging Test Case at 25° C.** | 0.688 | 0.856 | 0.510 | 4.000 |

*Results obtained with network having a depth in time of $\tilde{N}$ = 500
**Results obtained with network having a depth in time of $\tilde{N}$ = 1000

Figure 7:
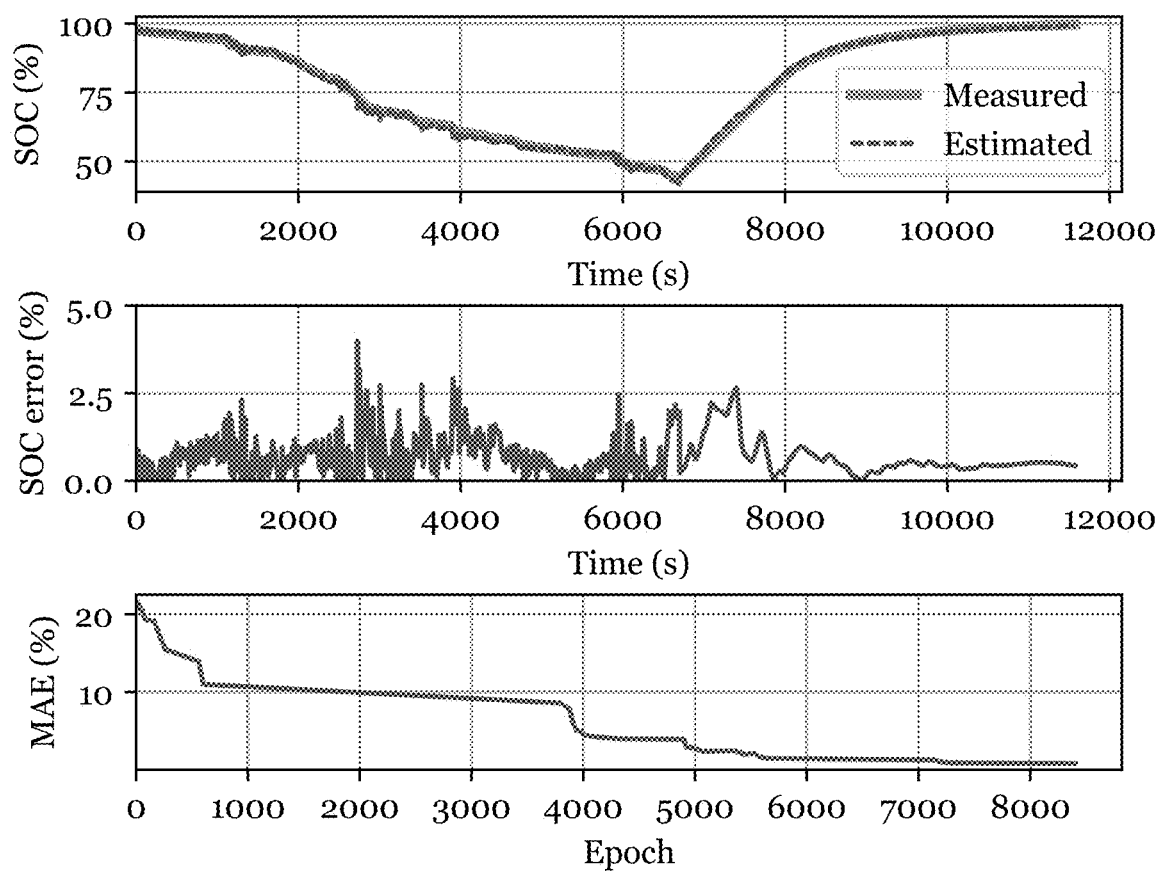
FIG. 7 is a set of graphs of performance on the Charging Test Case.

The LSTM-RNN also showed good performance when tested on the Charging Test Case where the MAE and MAX achieved is 0.688% and 4.000%, respectively. The estimation performance on the Charging Test Case is shown in FIG. 7. At the final training epoch, the error at every time step of the test case is shown in subplot 2. Also, at every training epoch, these errors over time are used to calculate the MAE. Therefore, a plot of MAE as a function of training epoch is shown in subplot3.

Figure 8:
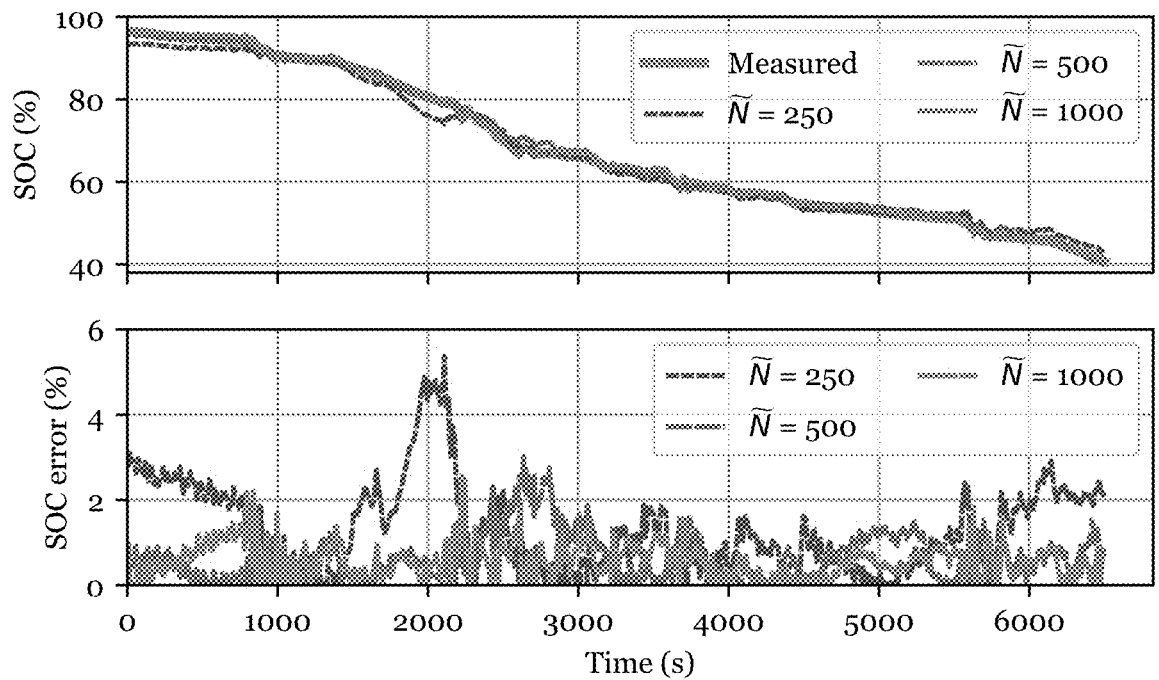
FIG. 8 is is a set of performance graphs.

Various tests illustrate the factors which influence the LSTM-RNN's estimation performance and to further validate this estimation strategy. In the first test, three LSTM-RNNs having different depths in time were trained, i.e. where $\tilde{N}$=250, 500 and 1000 at an ambient temperature of 10° C. The estimated SOC and the error over time of these different LSTM-RNNs are shown in FIG. 8 and their performance metrics are outlined as follows:

| Network Depth in Time ($\tilde{N}$) | MAE(%) | RMS(%) | STDDEV(%) | MAX(%) |
|---|---|---|---|---|
| 250 | 1.303 | 1.670 | 1.043 | 5.380 |
| 500 | 0.672 | 0.863 | 0.293 | 3.015 |
| 1000 | 0.573 | 0.690 | 0.148 | 2.569 |

Networks trained on data recorded at ambient temperature of 10° C.

To maintain an unbiased comparison between the network architectures tested, training is stopped at 15000 epochs in each case. It is observed that the networks having larger depths in time which are exposed to more historical data perform better than those exposed to a smaller amount of historical data. However, the increase in estimation accuracy is not linearly proportional to depth in time since going from $\tilde{N}$=250 to $\tilde{N}$=500 reduces the MAE by about a half however, going from $\tilde{N}$=500 to $\tilde{N}$=1000 offers only a 15% reduction in MAE.

Figure 9:
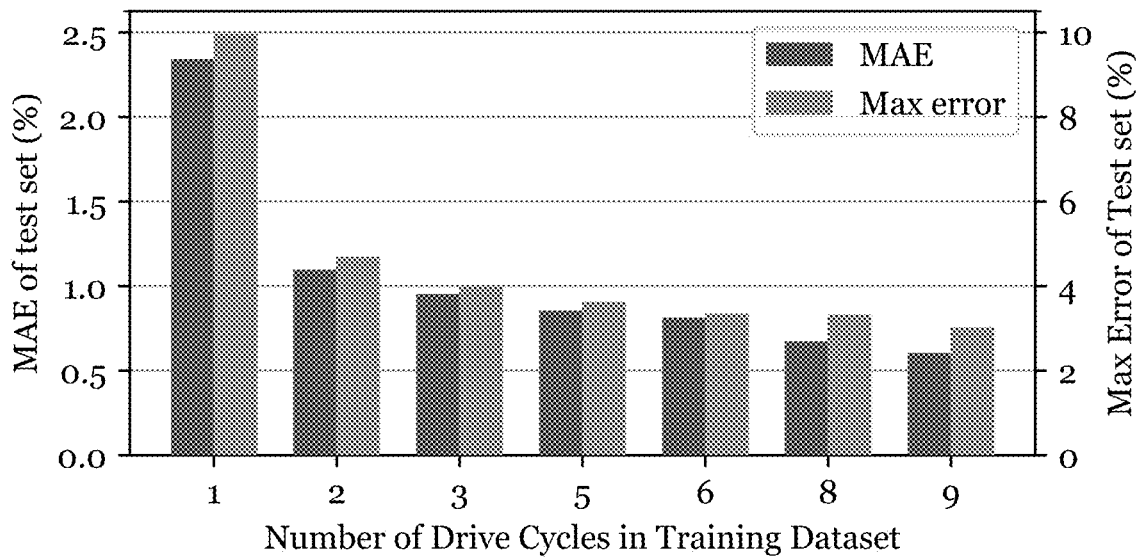
FIG. 9 is a plot of performance for different amounts of training data.

Another test is performed to measure the amount of training data needed to achieve good estimation accuracy. Therefore, instead of training the LSTM-RNN on a training dataset composed of 8 concatenated mixed drive cycles, as done to achieve the results in the first table above, FIG. 7, FIG. 8 and the table above, we record the estimation accuracy of LSTM-RNNs trained on different numbers of mixed drive cycles. This is shown in FIG. 9, where LSTM-RNNs are trained on one to nine mixed drive cycles and the MAE and max error measured over Test Case 1 are plotted in a bar graph. The more training data the network was exposed to, the more accuracy was achieved, however after a certain amount of training data (6-8 drive cycles), diminishing returns are obtained. Interestingly, the LSTM-RNN is able to achieve a MAE of below 1% when training is conducted on 3 or more drive cycles. This can be very advantageous since the LSTM-RNN can learn it's network parameters and achieve accurate SOC estimates after being exposed to relatively small amounts of training data.

Figure 10:
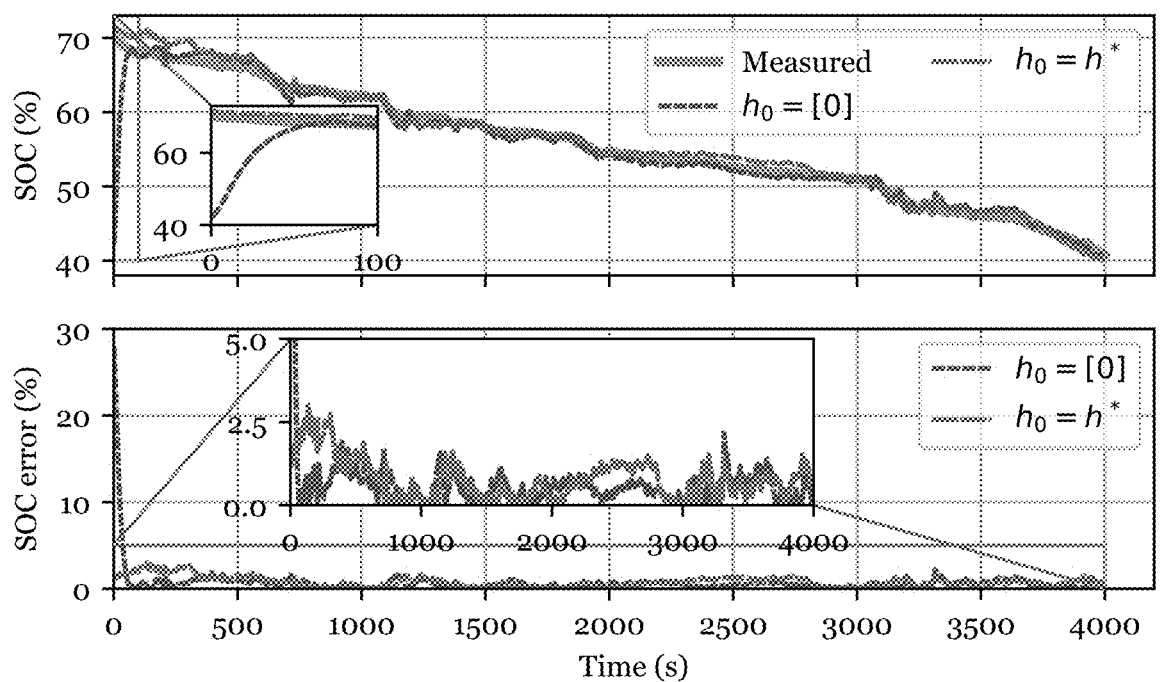
FIG. 10 is a pair of corresponding graphs of performance with correct and incorrect initialization.
Figure 11:
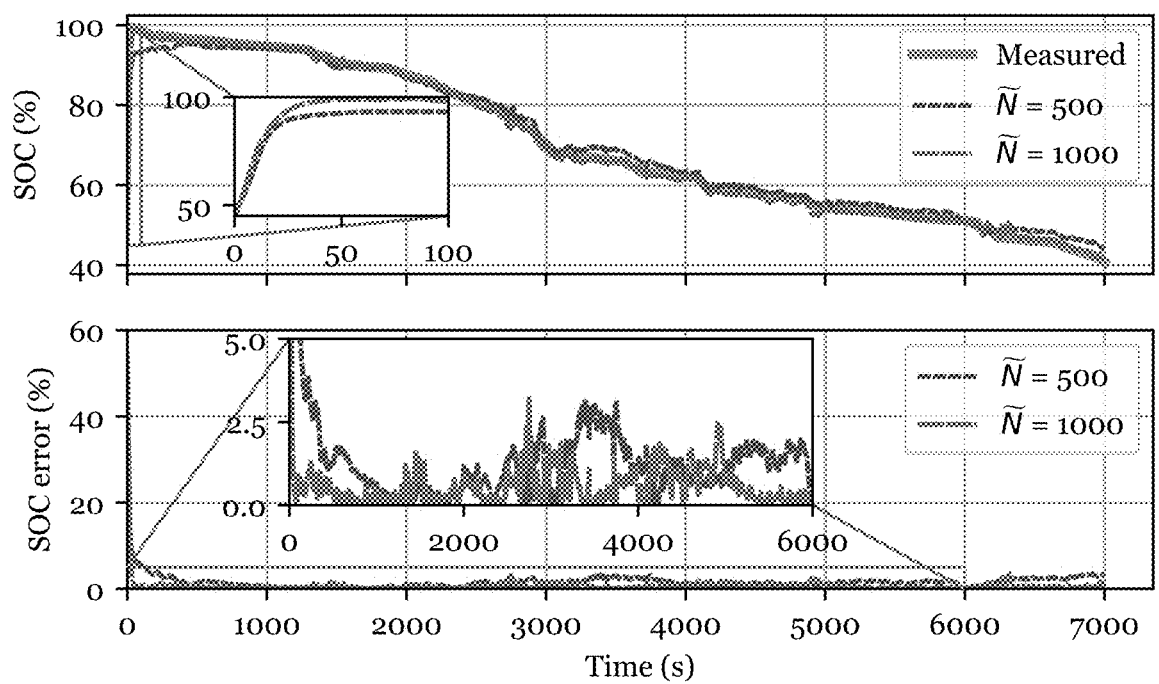
FIG. 11 is a set of graphs of performance with incorrect initialization.

Two additional tests are conducted to examine the LSTM-RNN's performance when either an incorrect initialization is given to the network or when the test drive cycle begins at different SOC levels. Giving an LSTM-RNN an incorrect initialization requires setting the hidden layer state at time step k=0 to zero. This is the only way to test for the case of incorrect initialization since the input vector given to the LSTM-RNN at every time step includes V(k), I(k) as well as T(k). SOC at time step k−1 or older are not used as feedback to the network. When correctly initialized, where $h_0=h^*$, an LSTM-RNN achieves good performance with MAE=0.776% on Test Case 1 which begins at SOC=70%, shown in FIG. 10. When given an incorrect initialization, where $h_0=0$, the LSTM-RNN struggles to estimate SOC at the start of the drive cycle (SOC=70%), where the error is about 27%, but quickly converges to a good state-of-charge estimate within the first 70 seconds of the drive cycle. Further validation is performed on this front by examining whether an LSTM-RNN that is deeper in time can converge quicker if given an incorrect initialization. This is shown in FIG. 11 where two LSTM-RNNs, one having depth in time of Ñ=500 and the other having Ñ=1000, are tested with incorrect initialization on Test Case 1 beginning at a SOC of 100%. It's clear that the LSTM-RNN which has a depth in time of Ñ=1000 seconds converges in less than 50 seconds which turns out to be faster than the LSTM-RNN having Ñ=500.

SOC Estimation at Varying Ambient Temperatures

A LSTM-RNN is constructed to handle a larger training dataset which is composed of 27 drive cycles. These 27 drive cycles include three sets of 9 drive cycles; each set is recorded at 0° C., 10° C. and 25° C. Another different mixed drive cycle, which is not a part of the training data, is used as a test case to validate the network's performance at each temperature. In particular, there are two goals that we desired to achieve within this second study. The first is to train the LSTM-RNN on datasets recorded at more than one ambient temperature such that one single LSTM-RNN can estimate SOC at different ambient temperature conditions. The second goal is to examine the LSTM-RNN's capability to interpolate its ability to estimate SOC at ambient temperatures different than the ones on which it was trained. The LSTM cell used in this study is unrolled for Ñ=1000 time steps and the time required to train this network is about 9 hours.

Figure 12:
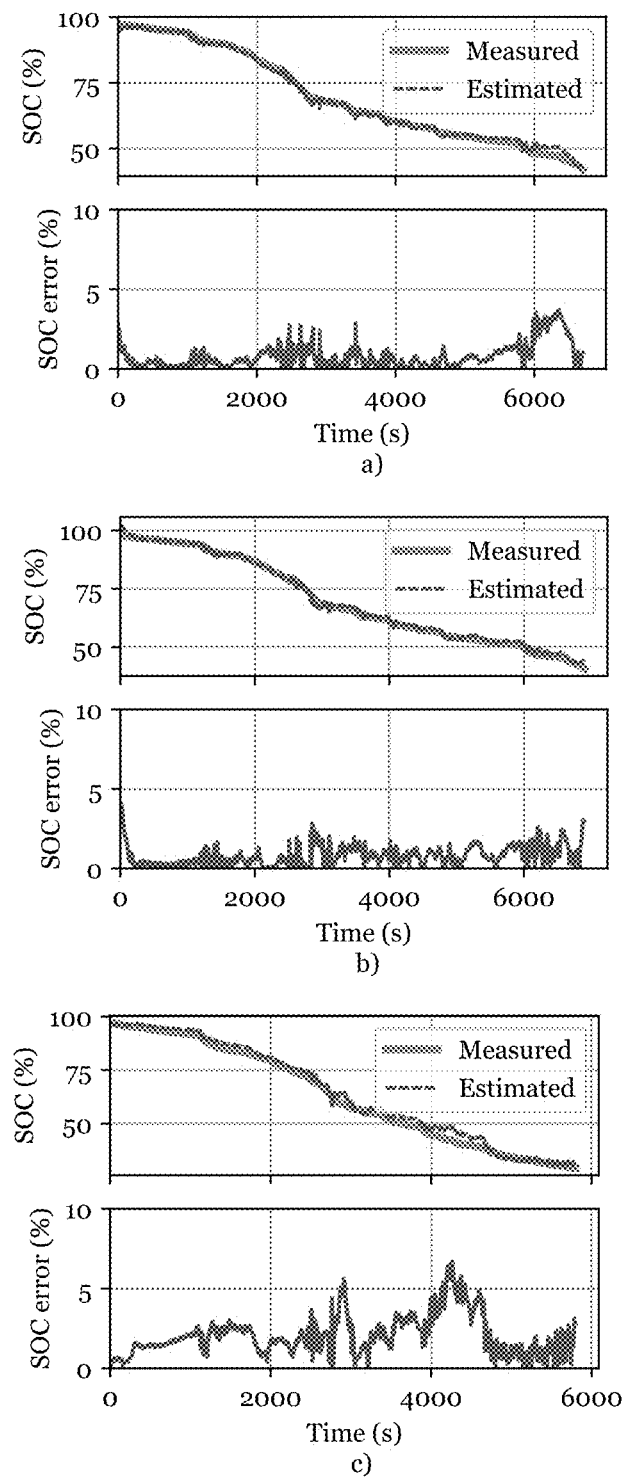
FIG. 12 is a graph of performance on Test Case 1.

The estimation performance of this single LSTM-RNN is shown in FIG. 12 where estimation performed at 25° C., 10° C. and 0° C. are plotted in a), b) and c), respectively. The MAE achieved at these three ambient temperatures is 0.774, 0.782 and 2.088. The MAE, RMS, STDDEV and MAX metrics achieved over all three ambient temperatures are outlined in the following table:

| SOC estimation accuracy of LSTM-RNN trained on multiple ambient temperature data | | | | |
| --- | --- | --- | --- | --- |
| Ambient Temperature | MAE(%) | RMS(%) | STDDEV(%) | MAX(%) |
| 25° C. | 0.774 | 1.110 | 0.796 | 3.692 |
| 10° C. | 0.782 | 0.995 | 0.616 | 4.047 |
| 0° C. | 2.088 | 2.444 | 1.270 | 6.687 |
| Varying Temperature | 1.606 | 2.038 | 1.256 | 5.815 |

The performance is good and validates the LSTM-RNN's ability to encode the dynamics experienced by a Li-ion battery at various ambient temperatures into the parameters of a single network.

Figure 13:
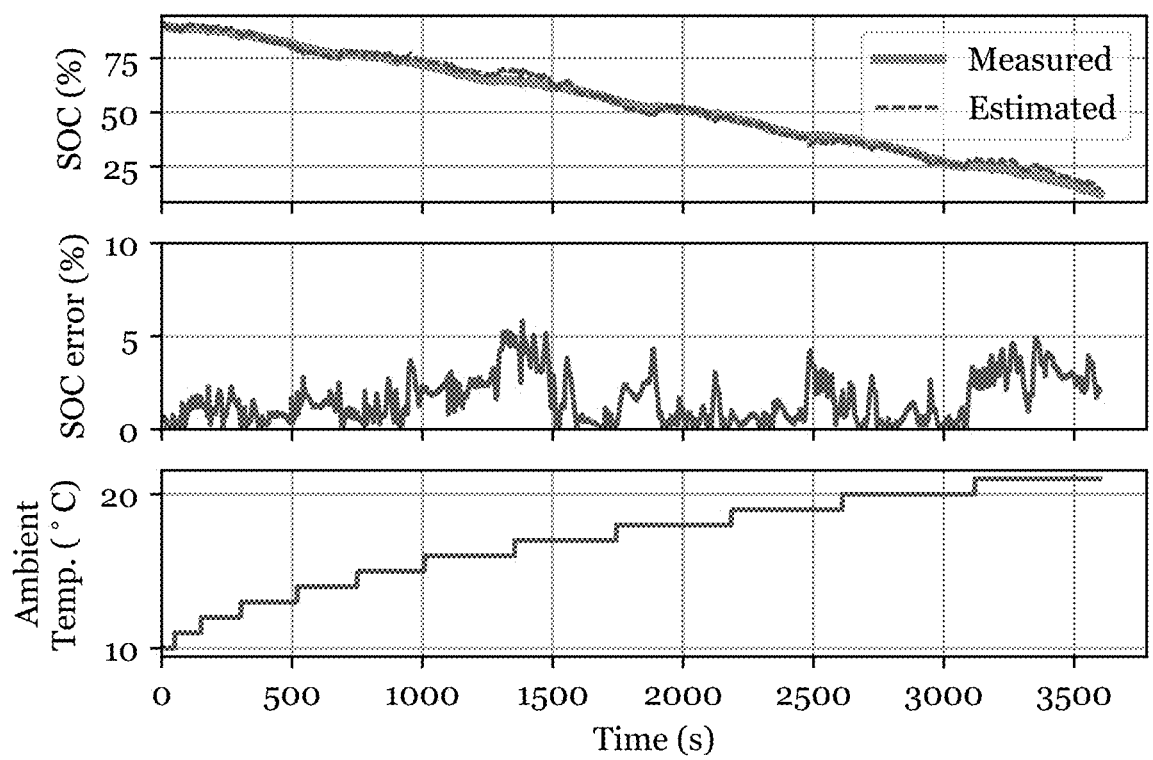
FIG. 13 is a set of graphs of performance with rising ambient temperature.

The single LSTM-RNN performed well for estimation on the validation test cases recorded at three different constant ambient temperatures however, battery-powered vehicles can undergo a change in ambient temperature of more than 10° C. over the course of one day depending on the climate or the geographical location within which they operate. Hence, an interesting test is to examine its performance on a test case, not included in the training data, which is recorded at a changing ambient temperature. Therefore, the LSTM-RNN's performance over a test case where the ambient temperature in the thermal chamber is increased from 10° C. to about 25° C. is shown in the table above, and in FIG. 13. The MAE achieved on this test case is 1.606% and showcases the LSTM-RNN's ability to perform estimation at ambient temperatures between 10° C. and 25° C. to which it is not exposed during the training process. This can be a great advantage if training data is scarce.

In some parameter estimation approaches, a gradient-based approach is used in which the parameter values are iteratively updated according to a computed gradient of the objective. One such gradient-based approach is a Back-Propagation procedure, but it should be understood that other procedures such as stochastic gradient procedures may equivalently be used.

The RNN structure introduced above should be understood to be only one example of a non-linear function structure that can be used to capture the cumulative effects of the measured quantities to yield accurate estimates of the battery state. For example, the transformation from input $x_k$ and past state $s_{k-1}$ to hidden state $s_k$ may use a deep neural network (DNN) structure with three, four, or more hidden layers. Convolutional neural networks can be used as well. That is, many different neural architectures can be used, the main ones being Recurrent Neural Networks (also RNN with LSTM or GRU), Deep Feedforward Neural Networks and Convolutional Neural Networks. A particular choice for structure of the non-linear function is a Long Short-Term Memory (LSTM) RNN, with details for such an implementation provided in the appended documents referenced below.

In some examples, the weights used in the estimation of battery states are selected based, for example, on the age of the battery system or other long-term conditions. For example, different weights are trained in different long-term conditions, thereby accommodating characteristically different non-linear mappings from observation to battery state.

The description above focuses on the battery state being the state of charge of the battery. Instead or in addition to the state of charge, a state of health of the battery system (e.g., capacity, peak voltage, internal resistance, self-discharge rate, etc.) may be estimated based on measurements in a like manner based on accurate measurements used to form appropriate training data sets.

Additional approaches, and features that may be incorporated into approaches described above, are described in U.S. Provisional Application 62/769,039, titled "Feedforward Neural-Network State-of-Charge Estimation," filed on Nov. 19, 2018, which is incorporated herein by reference.

The runtime estimation approach (i.e., implementation of the function N) may be implemented in software, in hardware, or in a combination of hardware and software. For example, software may include instructions, stored on a non-transitory machine-readable medium, that are executed on a processor (e.g., a general-purpose computer, embedded controller etc.). Hardware may include an Application Specific Integrated Circuit (ASIC), Field Programmable Gate Array (FPGA), discrete circuitry, and the like. The implementation may use digital representations of the quantities expressed above, with the measurements being digitized with Analog to Digital Converters (ADCs). In some implementations, some or all of the computations may be implemented using analog representations (e.g., analog voltages or currents). The parameter estimation approach may be implemented in hardware or software. Software implementations may use a general-purpose computers, and optionally may use attached processors such as Graphics Processing Units (GPUs).

REFERENCES

[Hochreiter and Schmidhuber, 1997] Hochreiter, S. and Schmidhuber, J. (1997). Long short-term memory. *Neural Computation*, 9(8):1735-1780.

[Kingma and Ba, 2014] Kingma, D. P. and Ba, J. (2014). Adam: A method for stochastic optimization. *CoRR*, abs/1412.6980.

[Kollmeyer, 2015] Kollmeyer, P. J. (2015). *Development and Implementation of a Battery-Electric Light-Duty Class 2a Truck including Hybrid Energy Storage*. PhD thesis, The University of Wisconsin—Madison.

[Kollmeyer et al., 2012] Kollmeyer, P. J., Lamb, W., Juang, L. W., McFarland, J. D., Jahns, T. M., and Sarlioglu, B. (2012). Design of an electric powertrain for a ford f150 crew cab truck utilizing a lithium battery pack and an interior pm synchronous machine drive. In *2012 IEEE Transportation Electrification Conference and Expo (ITEC)*, pages 1-8.

[Panasonic, 2016] Panasonic (2016). Panasonic NCR18650PF Lithium-Ion Battery Datasheet (June 2016).

What is claimed is:

1. A method for monitoring battery operation, the method comprising:
    receiving by a recurrent neural network (RNN), encoding characteristic behavior of a battery at multiple different ambient temperatures, a time series of values for one or more battery attributes for the battery, the one or more battery attributes comprising at least a current ambient temperature, wherein the RNN is trained based on backward-pass through the RNN of gradients of a loss function, representing the disparity between an actual state-of-charge value for the battery and a predicted value, computed for training set values corresponding to at least some of the multiple different ambient temperatures provided to the RNN during a respective forward-pass corresponding to the backward pass; and
    determining by the RNN encoding the characteristic behavior of the battery at the multiple different ambient temperatures, based on the received time series comprising the current ambient temperature, a state estimate for the battery.

2. The method of claim 1 wherein the battery comprises a rechargeable battery, and wherein receiving the time series of values of the attributes includes receiving a time series spanning multiple charging and discharging cycles.

3. The method of claim 1, wherein receiving time series of the values the one or more battery attributes comprises receiving values of one or more of a battery voltage, a battery current, and a battery temperature.

4. The method of claim 1 wherein the battery comprises a Lithium-ion (Li-ion) battery.

5. The method of claim 1 wherein the state estimate for the battery comprises a time series of values of state estimates corresponding to the time series of the values of the one or more battery attributes.

6. The method of claim 1 wherein the state estimate comprises a state-of-charge (SOC) estimate.

7. The method of claim 1, wherein the state estimate for the battery comprises data representative of one or more of battery capacity, and battery resistance.

8. The method of claim 1, further comprising controlling operation of at least one of the battery or a system powered by the battery based on the determined state estimate for the battery.

9. The method of claim 1, further comprising periodically configuring the RNN according to one or more of age of the battery, and a long-term condition of the battery.

10. The method of claim 1 wherein the recurrent neural network includes a memory cell configured to be selectively updated according to inputs to the recurrent neural network.

11. The method of claim 10 wherein the recurrent neural network comprises a Long Short-Term Memory cell.

12. A system for monitoring battery operation comprising:
    at least one sensor for measuring one or more battery attributes of at least one battery; and
    a recurrent neural network (RNN) system, encoding characteristic behavior of a battery at multiple different ambient temperatures, configured according to stored numerical parameters to:
        receive a time series of values for one or more battery attributes for the battery from the at least one sensor, the one or more battery attributes comprising at least a current ambient temperature, wherein the RNN system is trained based on backward-pass through the RNN system of gradients of a loss function, representing the disparity between an actual state-of-charge value for the battery and a predicted value, computed for training set values corresponding to at least some of the multiple different ambient temperatures provided to the RNN system during a respective forward-pass corresponding to the backward pass, and
        determine, based on the received time series comprising the current ambient temperature, a state estimate for the battery;
    wherein the RNN system comprises a memory cell configured to be selectively updated according to inputs to the recurrent neural network.

13. The system of claim 12 wherein the one or more battery attributes further comprise:
    a battery voltage;
    a battery current; and
    a battery temperature.

14. The system of claim 12 wherein the at least one battery comprises a Lithium-ion (Li-ion) battery.

15. The system of claim 12 wherein the state estimate for the at least one battery comprises a state-of-charge (SOC) estimate.

16. A non-transitory computer readable media programmed with instructions, executed by a processor, which performs the functions of:
- receiving by a recurrent neural network (RNN), encoding characteristic behavior of a battery at multiple different ambient temperatures, a time series of values for one or more battery attributes for the battery, the one or more battery attributes comprising at least a current ambient temperature, wherein the RNN is trained based on backward-pass through the RNN of gradients of a loss function, representing the disparity between an actual state-of-charge value for the battery and a predicted value, computed for training set values corresponding to at least some of the multiple different ambient temperatures provided to the RNN during a respective forward-pass corresponding to the backward pass; and
- determining by the RNN encoding the characteristic behavior of the battery at the multiple different ambient temperatures, based on the received time series comprising the current ambient temperature, a state of charge estimate for the battery.

* * * * *